United States Patent
Kersey et al.

(10) Patent No.: US 7,796,333 B2
(45) Date of Patent: Sep. 14, 2010

(54) ENCODED MICROPARTICLES AND A METHOD FOR FABRICATING

(75) Inventors: Alan D. Kersey, Glastonbury, CT (US); John A. Moon, San Diego, CA (US); Martin A. Putnam, Cheshire, CT (US)

(73) Assignee: Illumina, Inc., San Diego, CA (US)

( * ) Notice: Subject to any disclaimer, the term of this patent is extended or adjusted under 35 U.S.C. 154(b) by 0 days.

(21) Appl. No.: 12/235,834

(22) Filed: Sep. 23, 2008

(65) Prior Publication Data

US 2009/0073520 A1    Mar. 19, 2009

Related U.S. Application Data

(63) Continuation of application No. 11/283,518, filed on Nov. 17, 2005, now Pat. No. 7,508,608.

(60) Provisional application No. 60/629,093, filed on Nov. 17, 2004.

(51) Int. Cl.
*G02B 5/18* (2006.01)

(52) U.S. Cl. ............... 359/566; 359/900; 359/2; 438/32

(58) Field of Classification Search ............... None
See application file for complete search history.

(56) References Cited

U.S. PATENT DOCUMENTS

| | | |
|---|---|---|
| 3,074,634 A | 1/1963 | Gamo |
| 3,600,223 A | 8/1971 | Glick |
| 3,614,193 A | 10/1971 | Beiser |
| 3,791,788 A | 2/1974 | Taylor |
| 3,858,979 A | 1/1975 | Elbe |
| 3,880,497 A | 4/1975 | Bryngdahl |
| 3,891,302 A | 6/1975 | Dabby |
| 3,903,415 A | 9/1975 | Holzapfel |
| 3,916,182 A | 10/1975 | Dabby |
| 3,968,476 A | 7/1976 | McMahon |

(Continued)

FOREIGN PATENT DOCUMENTS

CH    598661    5/1978

(Continued)

OTHER PUBLICATIONS

"Introduction to Flow Cytometry: A Learning Guide"; BD Biosciences, San Jose CA, Apr. 2000, 54 pgs.

(Continued)

*Primary Examiner*—Arnel C Lavarias
(74) *Attorney, Agent, or Firm*—Small Patent Law Group; Dean D. Small; Jason P. Gross (57) ABSTRACT

A method for fabricating microparticles. The method includes providing a removable substrate that has a photosensitive material. The substrate has a plurality of inner regions. Each inner region surrounds a corresponding outer region. The method also includes providing at least one optically detectable code within at least one of the inner regions of the substrate and etching lines into the substrate to create a plurality of microparticles having at least one optically detectable code therein. The microparticles have elongated bodies that extend in an axial direction. The optically detectable codes extend in the axial direction within the microparticles.

40 Claims, 5 Drawing Sheets

U.S. PATENT DOCUMENTS

| | | |
|---|---|---|
| 4,011,435 A | 3/1977 | Phelps |
| 4,023,010 A | 5/1977 | Horst |
| 4,053,228 A | 10/1977 | Schiller |
| 4,053,433 A | 10/1977 | Lee |
| 4,131,337 A | 12/1978 | Moraw |
| 4,168,146 A | 9/1979 | Grubb |
| 4,301,139 A | 11/1981 | Feingers |
| 4,386,274 A | 5/1983 | Altshuler |
| 4,400,616 A | 8/1983 | Chevillat |
| 4,445,229 A | 4/1984 | Tasto |
| 4,447,546 A | 5/1984 | Hirschfeld |
| 4,537,504 A | 8/1985 | Baltes |
| 4,560,881 A | 12/1985 | Briggs |
| 4,562,157 A | 12/1985 | Lowe |
| 4,647,544 A | 3/1987 | Nicoli |
| 4,678,752 A | 7/1987 | Thorne |
| 4,685,480 A | 8/1987 | Eck |
| 4,688,240 A | 8/1987 | Hosemann |
| 4,690,907 A | 9/1987 | Hibino |
| 4,701,754 A | 10/1987 | Provonchee |
| 4,716,121 A | 12/1987 | Block |
| 4,725,110 A | 2/1988 | Glenn |
| 4,740,468 A | 4/1988 | Weng |
| 4,740,688 A | 4/1988 | Edwards |
| 4,748,110 A | 5/1988 | Paul |
| 4,762,420 A | 8/1988 | Bowley |
| 4,767,719 A | 8/1988 | Finlan |
| 4,770,295 A | 9/1988 | Carveth et al. |
| 4,807,950 A | 2/1989 | Glenn |
| 4,815,027 A | 3/1989 | Tokumitsu |
| 4,816,659 A | 3/1989 | Bianco |
| 4,822,746 A | 4/1989 | Walt |
| 4,841,140 A | 6/1989 | Sullivan |
| 4,843,631 A | 6/1989 | Steinpichler |
| 4,877,747 A | 10/1989 | Stewart |
| 4,880,752 A | 11/1989 | Keck |
| 4,882,288 A | 11/1989 | North |
| 4,921,805 A | 5/1990 | Gebeyehu |
| 4,931,384 A | 6/1990 | Layton |
| 4,937,048 A | 6/1990 | Sakai |
| 4,958,376 A | 9/1990 | Leib |
| 4,992,385 A | 2/1991 | Godfrey |
| 5,002,867 A | 3/1991 | Macevicz |
| 5,003,600 A | 3/1991 | Deason |
| RE33,581 E | 4/1991 | Nicoli |
| 5,028,545 A | 7/1991 | Soini |
| 5,030,558 A | 7/1991 | Litman |
| 5,033,826 A | 7/1991 | Kolner |
| 5,048,139 A | 9/1991 | Matsumi |
| 5,065,008 A | 11/1991 | Hakamata |
| 5,067,155 A | 11/1991 | Bianco |
| 5,081,012 A | 1/1992 | Flanagan |
| 5,089,387 A | 2/1992 | Tsay |
| 5,090,807 A | 2/1992 | Tai |
| 5,091,636 A | 2/1992 | Takada |
| 5,095,194 A | 3/1992 | Barbanell |
| 5,100,238 A | 3/1992 | Nailor |
| 5,104,209 A | 4/1992 | Hill |
| 5,105,305 A | 4/1992 | Betzig |
| 5,114,864 A | 5/1992 | Walt |
| 5,115,121 A | 5/1992 | Bianco |
| 5,118,608 A | 6/1992 | Layton |
| 5,129,974 A | 7/1992 | Aurenius |
| 5,138,468 A | 8/1992 | Barbanell |
| 5,141,848 A | 8/1992 | Donovan |
| 5,143,853 A | 9/1992 | Walt |
| 5,144,461 A | 9/1992 | Horan |
| 5,160,701 A | 11/1992 | Brown, III |
| 5,166,813 A | 11/1992 | Metz |
| 5,192,980 A | 3/1993 | Dixon |
| 5,196,350 A | 3/1993 | Backman |
| 5,200,794 A | 4/1993 | Nishiguma |
| 5,218,594 A | 6/1993 | Tanno |
| 5,239,178 A | 8/1993 | Derndinger |
| 5,244,636 A | 9/1993 | Walt |
| 5,283,777 A | 2/1994 | Tanno |
| 5,291,006 A | 3/1994 | Nishiguma |
| 5,291,027 A | 3/1994 | Kita |
| 5,300,764 A | 4/1994 | Hoshino |
| 5,307,332 A | 4/1994 | Tinet |
| 5,310,686 A | 5/1994 | Sawyers |
| 5,329,352 A | 7/1994 | Jacobsen |
| 5,342,790 A | 8/1994 | Levine |
| 5,349,442 A | 9/1994 | Deason |
| 5,352,582 A | 10/1994 | Lichtenwalter |
| 5,364,797 A | 11/1994 | Olson |
| 5,367,588 A | 11/1994 | Hill |
| 5,372,783 A | 12/1994 | Lackie |
| 5,374,816 A | 12/1994 | Bianco |
| 5,374,818 A | 12/1994 | Bianco |
| 5,388,173 A | 2/1995 | Glenn |
| 5,394,234 A | 2/1995 | Bianco |
| 5,395,558 A | 3/1995 | Tsai |
| 5,410,147 A | 4/1995 | Riza |
| 5,426,297 A | 6/1995 | Dunphy |
| 5,432,329 A | 7/1995 | Colgate |
| 5,442,433 A | 8/1995 | Hoshino |
| 5,448,659 A | 9/1995 | Tsutsui |
| 5,451,528 A | 9/1995 | Raymoure |
| 5,455,178 A | 10/1995 | Fattinger |
| 5,461,475 A | 10/1995 | Lerner |
| 5,465,176 A | 11/1995 | Bianco |
| 5,468,649 A | 11/1995 | Shah |
| 5,472,515 A | 12/1995 | Roberts |
| 5,506,674 A | 4/1996 | Inoue |
| 5,514,785 A | 5/1996 | Van Ness |
| 5,528,045 A | 6/1996 | Hoffman |
| 5,547,849 A | 8/1996 | Baer |
| 5,559,613 A | 9/1996 | Deveaud-Pledran |
| 5,585,639 A | 12/1996 | Dorsel |
| 5,587,832 A | 12/1996 | Krause |
| 5,607,188 A | 3/1997 | Bahns |
| 5,610,287 A | 3/1997 | Nikiforov |
| 5,620,853 A | 4/1997 | Smethers |
| 5,621,515 A | 4/1997 | Hoshino |
| 5,624,850 A | 4/1997 | Kumar |
| 5,625,472 A | 4/1997 | Mizrahi |
| 5,627,040 A | 5/1997 | Bierre |
| 5,627,663 A | 5/1997 | Horan |
| 5,633,724 A | 5/1997 | King |
| 5,633,790 A | 5/1997 | Gritter |
| 5,633,975 A | 5/1997 | Gary |
| 5,663,790 A | 9/1997 | Ekstrom |
| 5,667,976 A | 9/1997 | Van Ness |
| 5,671,308 A | 9/1997 | Inoue |
| 5,682,244 A | 10/1997 | Barlow |
| 5,712,912 A | 1/1998 | Tomko |
| 5,721,435 A | 2/1998 | Troll |
| 5,729,365 A | 3/1998 | Sweatt |
| 5,736,330 A | 4/1998 | Fulton |
| 5,742,432 A | 4/1998 | Bianco |
| 5,745,615 A | 4/1998 | Atkins |
| 5,745,617 A | 4/1998 | Starodubov |
| 5,759,778 A | 6/1998 | Li |
| 5,760,961 A | 6/1998 | Tompkin |
| 5,766,956 A | 6/1998 | Groger |
| 5,771,251 A | 6/1998 | Kringlebotn |
| 5,776,694 A | 7/1998 | Sheiness |
| 5,793,502 A | 8/1998 | Bianco |
| 5,798,273 A | 8/1998 | Shuler |
| 5,799,231 A | 8/1998 | Gates |
| 5,801,857 A | 9/1998 | Heckenkamp |
| 5,804,384 A | 9/1998 | Muller |
| 5,812,272 A | 9/1998 | King |

| | | |
|---|---|---|
| 5,822,472 A | 10/1998 | Danielzik |
| 5,824,478 A | 10/1998 | Muller |
| 5,824,557 A | 10/1998 | Burker |
| 5,830,622 A | 11/1998 | Canning |
| 5,831,698 A | 11/1998 | Depp |
| 5,837,475 A | 11/1998 | Dorsel |
| 5,837,552 A | 11/1998 | Cotton |
| 5,841,555 A | 11/1998 | Bianco |
| 5,846,737 A | 12/1998 | Kang |
| 5,861,113 A | 1/1999 | Choquette et al. |
| 5,874,187 A | 2/1999 | Colvin |
| 5,881,197 A | 3/1999 | Dong |
| 5,895,750 A | 4/1999 | Mushahwar |
| 5,922,550 A | 7/1999 | Everhart |
| 5,922,617 A | 7/1999 | Wang |
| 5,925,562 A | 7/1999 | Nova |
| 5,925,878 A | 7/1999 | Challener |
| 5,945,679 A | 8/1999 | Dorsel |
| 5,972,542 A | 10/1999 | Starodubov |
| 5,976,896 A | 11/1999 | Kumar |
| 5,981,166 A | 11/1999 | Mandecki |
| 5,986,838 A | 11/1999 | Thomas, III |
| 5,989,923 A | 11/1999 | Lowe |
| 5,992,742 A | 11/1999 | Sullivan |
| 5,998,796 A | 12/1999 | Liu |
| 6,001,510 A | 12/1999 | Meng |
| 6,005,691 A | 12/1999 | Grot |
| 6,017,754 A | 1/2000 | Chesnut |
| 6,025,129 A | 2/2000 | Nova |
| 6,025,283 A | 2/2000 | Robers |
| 6,027,694 A | 2/2000 | Boulton |
| 6,030,581 A | 2/2000 | Virtanen |
| 6,035,082 A | 3/2000 | Murphy |
| 6,036,807 A | 3/2000 | Brongers |
| 6,043,880 A | 3/2000 | Andrews |
| 6,046,925 A | 4/2000 | Tsien |
| 6,049,727 A | 4/2000 | Crothall |
| 6,057,107 A | 5/2000 | Fulton |
| 6,060,256 A | 5/2000 | Everhart |
| 6,067,167 A | 5/2000 | Atkinson |
| 6,067,392 A | 5/2000 | Wakami |
| 6,078,048 A | 6/2000 | Stevens |
| 6,084,995 A | 7/2000 | Clements |
| 6,087,186 A | 7/2000 | Cargill |
| 6,096,496 A | 8/2000 | Frankel |
| 6,096,596 A | 8/2000 | Gonzalez |
| 6,097,485 A | 8/2000 | Lievan |
| 6,103,535 A | 8/2000 | Pilevar |
| 6,118,127 A | 9/2000 | Liu |
| 6,128,077 A | 10/2000 | Jovin |
| 6,137,931 A | 10/2000 | Ishikawa |
| 6,143,247 A | 11/2000 | Sheppard, Jr. |
| 6,156,501 A | 12/2000 | McGall |
| 6,159,748 A | 12/2000 | Hechinger |
| 6,160,240 A | 12/2000 | Momma |
| 6,160,656 A | 12/2000 | Mossberg |
| 6,164,548 A | 12/2000 | Curiel |
| 6,165,592 A | 12/2000 | Berger |
| 6,165,648 A | 12/2000 | Covin |
| 6,174,648 B1 | 1/2001 | Terao |
| 6,194,563 B1 | 2/2001 | Cruickshank |
| 6,204,969 B1 | 3/2001 | Jang |
| 6,214,560 B1 | 4/2001 | Yguerabide |
| 6,218,194 B1 | 4/2001 | Lyndin |
| 6,221,579 B1 | 4/2001 | Everhart |
| 6,229,635 B1 | 5/2001 | Wulf |
| 6,229,827 B1 | 5/2001 | Fernald |
| 6,229,941 B1 | 5/2001 | Yoon |
| 6,242,056 B1 | 6/2001 | Spencer |
| 6,259,450 B1 | 7/2001 | Chiabrera |
| 6,262,846 B1 | 7/2001 | Nakai |
| 6,268,128 B1 | 7/2001 | Collins |
| 6,277,628 B1 | 8/2001 | Johann |
| 6,284,459 B1 | 9/2001 | Nova |
| 6,285,806 B1 | 9/2001 | Kersey |
| 6,288,220 B1 | 9/2001 | Kambara |
| 6,292,282 B1 | 9/2001 | Mossberg |
| 6,292,319 B1 | 9/2001 | Thomas, III |
| 6,301,047 B1 | 10/2001 | Hoshino |
| 6,304,263 B1 | 10/2001 | Chiabrera |
| 6,306,587 B1 | 10/2001 | Royer |
| 6,309,601 B1 | 10/2001 | Juncosa |
| 6,312,961 B1 | 11/2001 | Voirin |
| 6,313,771 B1 | 11/2001 | Munroe |
| 6,314,220 B1 | 11/2001 | Mossberg |
| 6,319,668 B1 | 11/2001 | Nova |
| 6,321,007 B1 | 11/2001 | Sanders |
| 6,322,932 B1 | 11/2001 | Colvin |
| RE37,473 E | 12/2001 | Challener |
| 6,328,209 B1 | 12/2001 | O'Boyle |
| 6,329,963 B1 | 12/2001 | Chiabrera |
| 6,331,273 B1 | 12/2001 | Nova |
| 6,335,824 B1 | 1/2002 | Overbeck |
| 6,340,588 B1 | 1/2002 | Nova |
| 6,352,854 B1 | 3/2002 | Nova |
| 6,355,198 B1 | 3/2002 | Kim |
| 6,355,432 B1 | 3/2002 | Fodor |
| 6,356,681 B1 | 3/2002 | Chen |
| 6,359,734 B1 | 3/2002 | Staub |
| 6,361,958 B1 | 3/2002 | Shieh |
| 6,363,097 B1 | 3/2002 | Linke |
| 6,371,370 B2 | 4/2002 | Sadler |
| 6,372,428 B1 | 4/2002 | Nova |
| 6,383,754 B1 | 5/2002 | Kaufman |
| 6,391,562 B2 | 5/2002 | Kambara |
| 6,395,558 B1 | 5/2002 | Duveneck |
| 6,399,295 B1 | 6/2002 | Kaylor |
| 6,399,935 B1 | 6/2002 | Jovin |
| 6,403,320 B1 | 6/2002 | Read |
| 6,406,841 B1 | 6/2002 | Lee |
| 6,406,848 B1 | 6/2002 | Bridgham |
| 6,416,714 B1 | 7/2002 | Nova |
| 6,416,952 B1 | 7/2002 | Pirrung |
| 6,417,010 B1 | 7/2002 | Cargill |
| 6,428,707 B1 | 8/2002 | Berger |
| 6,428,957 B1 | 8/2002 | Delenstarr |
| 6,429,022 B1 | 8/2002 | Kunz |
| 6,433,849 B1 | 8/2002 | Lowe |
| 6,436,651 B1 | 8/2002 | Everhart |
| 6,440,667 B1 | 8/2002 | Fodor |
| 6,456,762 B1 | 9/2002 | Nishiki |
| RE37,891 E | 10/2002 | Collins |
| 6,462,770 B1 | 10/2002 | Cline |
| 6,489,606 B1 | 12/2002 | Kersey |
| 6,496,287 B1 | 12/2002 | Seiberle |
| 6,506,342 B1 | 1/2003 | Frankel |
| 6,514,767 B1 | 2/2003 | Natan |
| 6,515,753 B2 | 2/2003 | Maher |
| 6,522,406 B1 | 2/2003 | Rovira |
| 6,524,793 B1 | 2/2003 | Chandler |
| 6,533,183 B2 | 3/2003 | Aasmul |
| 6,542,673 B1 | 4/2003 | Holter |
| 6,544,739 B1 | 4/2003 | Fodor |
| 6,545,758 B1 | 4/2003 | Sandstrom |
| 6,552,809 B1 | 4/2003 | Bergeron |
| 6,560,017 B1 | 5/2003 | Bianco |
| 6,565,770 B1 | 5/2003 | Mayer |
| 6,576,424 B2 | 6/2003 | Fodor |
| 6,578,712 B2 | 6/2003 | Lawandy |
| 6,592,036 B2 | 7/2003 | Sadler |
| 6,594,421 B1 | 7/2003 | Johnson |
| 6,609,728 B1 | 8/2003 | Voermann |
| 6,613,581 B1 | 9/2003 | Wada |
| 6,618,342 B1 | 9/2003 | Johnson |
| 6,622,916 B1 | 9/2003 | Bianco |
| 6,628,439 B2 | 9/2003 | Shiozawa |

| Patent Number | Date | Name |
|---|---|---|
| 6,632,655 B1 | 10/2003 | Mehta |
| 6,635,470 B1 | 10/2003 | Vann |
| 6,635,863 B1 | 10/2003 | Nihommori |
| 6,646,243 B2 | 11/2003 | Pirrung |
| 6,657,758 B1 | 12/2003 | Garner |
| 6,660,147 B1 | 12/2003 | Woudenberg |
| 6,678,429 B2 | 1/2004 | Mossberg |
| RE38,430 E | 2/2004 | Rosenstein |
| 6,689,316 B1 | 2/2004 | Blyth |
| 6,692,031 B2 | 2/2004 | McGrew |
| 6,692,912 B1 | 2/2004 | Boles |
| 6,708,618 B1 * | 3/2004 | Tsai .................... 101/491 |
| 6,794,658 B2 | 9/2004 | MacAulay |
| 6,806,954 B2 | 10/2004 | Sandstrom |
| 6,858,184 B2 | 2/2005 | Pelrine |
| 6,874,639 B2 | 4/2005 | Lawandy |
| 6,881,789 B2 | 4/2005 | Bossé |
| 6,892,001 B2 | 5/2005 | Ohta |
| 6,905,885 B2 | 6/2005 | Colston |
| 6,908,737 B2 | 6/2005 | Ravkin |
| 6,919,009 B2 | 7/2005 | Stonas |
| 6,982,996 B1 | 1/2006 | Putnam |
| 7,045,049 B1 | 5/2006 | Natan |
| 7,065,032 B2 | 6/2006 | Horimai |
| 7,080,857 B2 * | 7/2006 | Patton et al. ............. 283/70 |
| 7,092,160 B2 | 8/2006 | Putnam |
| 7,106,513 B2 | 9/2006 | Moon |
| 7,122,384 B2 | 10/2006 | Prober |
| 7,126,755 B2 | 10/2006 | Moon |
| 7,164,533 B2 | 1/2007 | Moon |
| 7,190,522 B2 | 3/2007 | Moon |
| 7,215,628 B2 | 5/2007 | Horimai |
| 7,225,082 B1 | 5/2007 | Natan |
| 7,321,541 B2 | 1/2008 | Horimai |
| 7,339,148 B2 | 3/2008 | Kawano |
| 7,349,158 B2 | 3/2008 | Moon |
| 7,375,890 B2 | 5/2008 | Putnam |
| 7,399,643 B2 | 7/2008 | Moon et al. |
| 7,433,123 B2 | 10/2008 | Putnam et al. |
| 7,441,703 B2 | 10/2008 | Moon |
| 7,508,608 B2 | 3/2009 | Kersey |
| 7,602,952 B2 | 10/2009 | Kersey |
| 7,604,173 B2 | 10/2009 | Kersey |
| 7,619,819 B2 | 11/2009 | Moon |
| 2001/0007775 A1 | 7/2001 | Seul |
| 2001/0029049 A1 | 10/2001 | Walt |
| 2002/0000471 A1 | 1/2002 | Aasmul |
| 2002/0006664 A1 | 1/2002 | Sabatini |
| 2002/0018430 A1 | 2/2002 | Heckenkamp |
| 2002/0021003 A1 | 2/2002 | McGrew |
| 2002/0022273 A1 | 2/2002 | Empedocles |
| 2002/0025534 A1 | 2/2002 | Goh |
| 2002/0031783 A1 | 3/2002 | Empedocles |
| 2002/0034747 A1 | 3/2002 | Bruchez |
| 2002/0039728 A1 | 4/2002 | Kain |
| 2002/0039732 A1 | 4/2002 | Bruchez |
| 2002/0074513 A1 | 6/2002 | Abel |
| 2002/0084329 A1 | 7/2002 | Kaye |
| 2002/0090650 A1 | 7/2002 | Empedocles |
| 2002/0094528 A1 | 7/2002 | Salafsky |
| 2002/0097658 A1 | 7/2002 | Worthington |
| 2002/0155490 A1 | 10/2002 | Skinner |
| 2002/0174918 A1 | 11/2002 | Fujimura et al. |
| 2002/0197456 A1 | 12/2002 | Pope |
| 2003/0008323 A1 | 1/2003 | Ravkin |
| 2003/0021003 A1 | 1/2003 | Ono |
| 2003/0032203 A1 | 2/2003 | Sabatini |
| 2003/0077038 A1 | 4/2003 | Murashima |
| 2003/0082568 A1 | 5/2003 | Phan |
| 2003/0082587 A1 | 5/2003 | Seul |
| 2003/0129654 A1 * | 7/2003 | Ravkin et al. ............. 435/7.1 |
| 2003/0138208 A1 | 7/2003 | Pawlak |
| 2003/0142704 A1 | 7/2003 | Lawandy |
| 2003/0142713 A1 | 7/2003 | Lawandy |
| 2003/0153006 A1 | 8/2003 | Washizu |
| 2003/0162296 A1 | 8/2003 | Lawandy |
| 2003/0184730 A1 | 10/2003 | Price |
| 2003/0203390 A1 | 10/2003 | Kaye |
| 2003/0228610 A1 | 12/2003 | Seul |
| 2004/0027968 A1 | 2/2004 | Horimai |
| 2004/0047030 A1 | 3/2004 | MacAulay |
| 2004/0062178 A1 | 4/2004 | Horimai |
| 2004/0075907 A1 | 4/2004 | Moon |
| 2004/0100636 A1 | 5/2004 | Somekh |
| 2004/0100892 A1 | 5/2004 | Horimai |
| 2004/0125370 A1 | 7/2004 | Montagu |
| 2004/0125424 A1 | 7/2004 | Moon |
| 2004/0126875 A1 | 7/2004 | Putnam et al. |
| 2004/0132205 A1 | 7/2004 | Moon |
| 2004/0156471 A1 | 8/2004 | Sakata |
| 2004/0170356 A1 | 9/2004 | Iazikov |
| 2004/0175842 A1 | 9/2004 | Roitman |
| 2004/0209376 A1 | 10/2004 | Natan |
| 2004/0233485 A1 | 11/2004 | Moon |
| 2004/0263923 A1 | 12/2004 | Moon |
| 2005/0042764 A1 | 2/2005 | Sailor |
| 2005/0056587 A1 | 3/2005 | Allen |
| 2005/0220408 A1 | 10/2005 | Putnam |
| 2005/0227252 A1 | 10/2005 | Moon |
| 2005/0270603 A1 | 12/2005 | Putnam |
| 2006/0023310 A1 | 2/2006 | Putnam |
| 2006/0028727 A1 | 2/2006 | Moon |
| 2006/0050544 A1 | 3/2006 | Horimai |
| 2006/0057729 A1 | 3/2006 | Moon |
| 2006/0063271 A1 | 3/2006 | Putnam |
| 2006/0067179 A1 | 3/2006 | Matsumoto |
| 2006/0071075 A1 | 4/2006 | Moon |
| 2006/0072177 A1 | 4/2006 | Putnam |
| 2006/0118630 A1 | 6/2006 | Kersey |
| 2006/0119913 A1 | 6/2006 | Moon |
| 2006/0132877 A1 | 6/2006 | Kersey |
| 2006/0134324 A1 | 6/2006 | Putnam |
| 2006/0139635 A1 | 6/2006 | Kersey |
| 2006/0140074 A1 | 6/2006 | Horimai |
| 2006/0160208 A1 | 7/2006 | Putnam |
| 2007/0121181 A1 | 5/2007 | Moon |
| 2007/0236789 A1 | 10/2007 | Moon |
| 2008/0085565 A1 | 4/2008 | Moon |
| 2008/0129990 A1 | 6/2008 | Moon |
| 2008/0165656 A1 | 7/2008 | Moon et al. |
| 2008/0170664 A1 | 7/2008 | Kalman |
| 2008/0192311 A1 | 8/2008 | Horimai |
| 2009/0034078 A1 | 2/2009 | Putnam |
| 2009/0040885 A1 | 2/2009 | Horimai |
| 2009/0073520 A1 | 3/2009 | Kersey |
| 2009/0194589 A1 | 8/2009 | Moon et al. |
| 2010/0025482 A1 | 2/2010 | Moon |
| 2010/0072278 A1 | 3/2010 | Putnam |
| 2010/0099574 A1 | 4/2010 | Moon |

FOREIGN PATENT DOCUMENTS

| | | |
|---|---|---|
| DE | 2416652 | 10/1975 |
| EP | 0 395 300 | 10/1990 |
| EP | 0 723 149 | 7/1996 |
| EP | 0 798 573 A1 | 10/1997 |
| EP | 0 911 667 A1 | 4/1999 |
| EP | 916981 | 5/1999 |
| EP | 0 972 817 A1 | 1/2000 |
| EP | 1182054 | 2/2002 |
| EP | 1219979 | 7/2002 |
| GB | 2 118 189 | 10/1983 |
| GB | 2129551 | 5/1984 |
| GB | 2 138 821 | 10/1984 |
| GB | 2 299 235 | 9/1996 |
| GB | 2 306 484 | 5/1997 |

| | | |
|---|---|---|
| GB | 2 319 838 | 6/1998 |
| GB | 2372100 | 8/2002 |
| JP | 20035521 | 2/2000 |
| WO | WO 91/06496 | 5/1991 |
| WO | WO 93/09668 | 5/1993 |
| WO | WO 94/28119 | 12/1994 |
| WO | WO 96/24061 | 8/1996 |
| WO | WO 96/36436 | 11/1996 |
| WO | WO9636436 | 11/1996 |
| WO | WO 97/12680 | 4/1997 |
| WO | WO 97/15390 | 5/1997 |
| WO | WO 97/15690 | 5/1997 |
| WO | WO 97/17258 | 5/1997 |
| WO | WO 97/31282 | 8/1997 |
| WO | WO 97/34171 | 9/1997 |
| WO | WO 98/04740 | 2/1998 |
| WO | WO 98/24549 | 6/1998 |
| WO | WO 99/02266 | 1/1999 |
| WO | WO 99/09042 | 2/1999 |
| WO | WO 99/32654 | 7/1999 |
| WO | WO 99/42209 | 8/1999 |
| WO | WO 00/08443 | 2/2000 |
| WO | WO0016893 | 3/2000 |
| WO | WO 00/37914 | 6/2000 |
| WO | WO 00/37969 | 6/2000 |
| WO | WO 00/39617 | 7/2000 |
| WO | WO 00/63419 | 10/2000 |
| WO | WO0061198 | 10/2000 |
| WO | WO0158583 | 8/2001 |
| WO | WO0171322 | 9/2001 |
| WO | WO 01/78889 | 10/2001 |
| WO | WO0178889 | 10/2001 |
| WO | WO 02/059603 | 8/2002 |
| WO | WO02059306 | 8/2002 |
| WO | WO 02064829 | 8/2002 |
| WO | WO03061983 | 7/2003 |
| WO | WO 03091731 | 11/2003 |
| WO | WO 2004011940 | 2/2004 |
| WO | WO 2004015418 | 2/2004 |
| WO | WO 2004/025561 | 3/2004 |
| WO | WO 2004/025563 | 3/2004 |
| WO | WO2004019276 | 3/2004 |
| WO | WO2004024328 | 3/2004 |
| WO | WO2004025562 | 3/2004 |
| WO | WO 2004/034012 | 4/2004 |
| WO | WO 2004046697 | 6/2004 |
| WO | WO2004066210 | 8/2004 |
| WO | WO 2005/026729 | 3/2005 |
| WO | WO 2005/027031 | 3/2005 |
| WO | WO 2005/029047 | 3/2005 |
| WO | WO 2005/033681 | 4/2005 |
| WO | WO 2005/050207 | 6/2005 |
| WO | WO 2005/079544 | 9/2005 |
| WO | WO 2006/020363 | 2/2006 |
| WO | WO 2006/055735 | 5/2006 |
| WO | WO 2006/055736 | 5/2006 |
| WO | WO 2006/076053 | 7/2006 |

OTHER PUBLICATIONS

Jain KK, Nanodiagnostics: Application of Nanotechnology in Molecular Diagnostics, Expert Review of Molecular Diagnostics 3(2):153-161 (2003), XP008038849.
Lide (CRC Handbook of Chemistry and Physics, 71st ed.).
Othonos, X. Lee; Superimposed Multiple Bragg Gratings, Nov. 10, 1994, vol. 30, No. 23.
Patil et al. (AAPS PharmSciTech, Mar. 24, 2006, vol. 7, pp. E1-E7).
Po Ki Yuen, Microbarcode Sorting Device; Science & Technology, Corning Incorparated, Corning, New York 14831-0007, USA.
International Search Report and Written Opinion for International Application No. PCT/US2003/26315.
International Search Report and Written Opinion for International Application No. PCT/US2003/26316.
International Search Report for International Application No. PCT/US2003/28862.
International Search Report for International Application No. PCT/US2003/28874.
International Search Report for International Application No. PCT/US2003/28875.
International Search Report for International Application No. PCT/US2003/28887.
International Search Report for International Application No. PCT/US2003/28890.
International Search Report and Written Opinion for International Application No. PCT/US2003/29164.
International Search Report for International Application No. PCT/US2003/29244.
International Search Report and Written Opinion for International Application No. PCT/US2004/01685.
International Search Report and Written Opinion for International Application No. PCT/US2004/30037.
International Search Report and Written Opinion for International Application No. PCT/US2004/30038.
International Search Report and Written Opinion for International Application No. PCT/US2004/30300.
International Search Report and Written Opinion for International Application No. PCT/US2004/32084.
International Search Report and Written Opinion for International Application No. PCT/US2004/38416.
International Search Report and Written Opinion for International Application No. PCT/US2005/05743.
International Search Report and Written Opinion for International Application No. PCT/US2005/05745.
International Search Report and Written Opinion for International Application No. PCT/US2005/26289.
International Search Report and Written Opinion for International Application No. PCT/US2005/33694.
International Search Report and Written Opinion for International Application No. PCT/US2005/41730.
International Search Report and Written Opinion for International Application No. PCT/US2005/41731.
"Compact Disc Arrayer"; V&P Scientific; Nov. 17, 2003; pp. 1-4.
"Electronically Scanned Confocal Imaging System"; IBM Technical Disclosure Bulletin; vol. 36; No. 06B; Jun. 1993; pp. 261-262.
"Ben Beune Patent Licensing Director of Philips IP&S"; Replication & Duplication—News Jan.-Feb. 2002; pp. 1-2.
Andrew Marshall; "DNA Chips: Array of Possibilities"; Nature Biotechnology vol. 16 Jan. 1998; pp. 27-31.
Burstein Technology, Inc.; "Angel Strategies Tombstone"; 1 pg.
de Beer et al., "Forward-Scattering Degenerate Four-Wave Mixing for Sensitive Absorption Detection in Microseparation Systems Coupling to Micro-Column Liquid Chromatography"; Journal of Chromatography A. 811 (1998); pp. 35-45.
Fonjallaz et al., "Interferometric Side Diffraction Technique for the Characterisation of Fiber Gratings"; 1999 OSA Conference, Sep. 23-25; 3 pgs.
G. Kakarantzas et al.;"Transmission Filters Based on periodically Micro-tapered Fibre"; CLE0/2000/Friday Morning; 8:45 a.m.; pp. 574-575.
Hideki Kambara; Recent Progress in fluorescent DNA Analyzers and Methods; Current Topics in Analytical checmistry; vol. 1, (1998) pp. 21-36.
Ivan Oransky; "Sequencing on Compact Disc? Microgenomics of Breast Cancer; Better Binding Site Prediction"; vol. 17 / Issue 13 / 35 / Jun. 30, 2003; 13 pgs.
Kashyap R.; "Fiber Bragg Gratings"; Academic Press, Ch. 9; pp. 430-433.
Kogelnik H; "Coupled Wave Theory for Thick Hologram Gratings"; The Bell System Technical Journal, 48(9):2909-2947 (1969).
Krug P., "Measurement of Index Modulation Along an Optical Fiber Bragg Grating"; Optics Letters, 20(17)1767-1769.
Leith et al., "Holographic Data Storage in Three-Dimensional Media"; Applied Optics, vol. 5, No. 8, Aug. 1966; 21 pgs.
Mark O. Worthington; "Curriculum Vitae"; Jan. 5, 2004; 4 pgs.
Masato Mitsuhashi; "Gene Manipulation on Plastic Plates"; Nature, vol. 357, Jun. 11, 1992, pp. 519-520.

Michael C. Needels et al.; "Generation and Screening of an Oligonucleotide-Encoded Synthetic Peptide Library"; Proc Natl. Acad. Sci. USA, vol. 90;pp. 10700-10704, Nov. 1993.

Michael J. Kozal; "Extensive Polymorphisms Observed in HIV-1 Clade B Protease Gene Using High-Density Oligonucleotide Arrays"; Nature Medicine, vol. 2, No. 7, Jul. 1996; pp. 753-759.

Shelia R. Nicerwarner-Peã, "Submicrometer Metallic Barcodes"; Science, vol. 294; Oct. 5, 2001; 5 pgs.

Thomas Laurell; "Enhanced Enzyme Activity in Silicon Integrated Enzyme Reactors Utilizing Porous Silicon as the Coupling Matrix"; Sensor & Actuators B 31 (1996); pp. 161-166.

Vander Lugt; "Design Relationships for Holographic Memories"; Applied Optics, vol. 12, No. 7, Jul. 1973; pp. 1675-1685.

W.R. Rigby; "An Anodizing Process for the Production of Inorganic Microfiltration Membranes"; 2436Transactions of the Institute of Metal Finishing;68(Aug. 1990),Part 3 p. 95-98.

Yoshinobu Kohara; "DNA Probes on Beads Arrayed in a Capillary, 'Bead-Array',Exhibited High Hybridization Performance"; Nucleic Acids Research, 2002, vol. 30, No. 16 e87; 7 pgs.

Material Safety Data Sheet Aquaclean 900; Aquabond Technologies (ABT); 1 pg., 2000.

US 6,780,301, 08/2004, Natan (withdrawn)

* cited by examiner

Illustration (a)

Illustration (b)

Illustration (c)

FIG. 7

ENCODED MICROPARTICLES AND A METHOD FOR FABRICATING

CROSS REFERENCES TO RELATED APPLICATIONS

This application claims benefit to and is a continuation of U.S. patent application Ser. No. 11/283,518, filed on Nov. 17, 2005 now U.S. Pat. No. 7,508,608, which claims the benefit of U.S. Provisional Patent Application No. 60/629,093, filed Nov. 17, 2004, both of which are hereby incorporated by reference in their entirety.

The following cases contain subject matter related to that disclosed herein and are incorporated herein by reference in their entirety: U.S. patent application Ser. No. 10/661,234, filed Sep. 12, 2003, entitled "Diffraction Grating-Based Optical Identification Element"; U.S. patent application Ser. No. 10/661,031 filed Sep. 12, 2003, entitled "Diffraction Grating-Based Encoded Micro-particles for Multiplexed Experiments"; U.S. patent application Ser. No. 10/661,082, filed Sep. 12, 2003, entitled "Method and Apparatus for Labeling Using Diffraction Grating-Based Encoded Optical Identification Elements"; U.S. patent application Ser. No. 10/661,115, filed Sep. 12, 2003, entitled "Assay Stick"; U.S. patent application Ser. No. 10/661,836, filed Sep. 12, 2003, entitled "Method and Apparatus for Aligning Microbeads in order to Interrogate the Same"; U.S. patent application Ser. No. 10/661,254, filed Sep. 12, 2003, entitled "Chemical Synthesis Using Diffraction Grating-based Encoded Optical Elements"; U.S. patent application Ser. No. 10/661,116, filed Sep. 12, 2003, entitled "Method of Manufacturing of a Diffraction grating-based identification Element"; and U.S. patent application Ser. No. 10/763,995, filed Jan. 22, 2004, entitled, "Hybrid Random Bead/Chip Based Microarray", U.S. Provisional Patent Application Ser. Nos. 60/609,583, 60/610,059 and 60/609,712, all filed Sep. 13, 2004; U.S. Provisional Patent Application Ser. Nos. 60/611,205, 60/610,910, 60/610,833, 60/610,829, 60/610,928, all filed Sep. 17, 2004; U.S. Provisional Patent Application Ser. No. 60/611,676, filed Sep. 20, 2004; and U.S. patent application Ser. No. 10/956,791, filed Oct. 1, 2004.

BACKGROUND OF INVENTION

Technical Field

The present invention relates to a method and apparatus for fabricating an optical identification element; and more particularly to a method and apparatus for fabricating a holographic optical identification element using a lithographic technique, as well as the holographic optical identification element itself.

SUMMARY OF INVENTION

The present invention provides a new and unique method for fabricating an optical identification element, wherein a removable plate or substrate having a photosensitive material fabricated on is provided, one or more gratings are written on the photosensitive material, then lines are etched to create one or more separate optical identification elements.

The one or more gratings may be written by exposing the photosensitive material to ultraviolet (UV) light.

The lines may be etched to create the one or more separate optical identification elements by photolithography to define/create the same.

The one or more separate optical identification element are planar elements.

The optical identification element may take the form of a holographic optical identification element having one of the following geometric shapes, such as a plate, a bar, a brick, a disc, a slab, etc.

The method according to the present invention enables many possible options, geometries, sizes, photosensitive materials in relation to the overall fabrication of an optical identification element.

The present invention also includes the possibly of using a surface relief grating, a densification grating, cover slips, or borosilicate.

The scope of the invention is also intended to include the apparatus for fabricating an optical identification element consistent with the description of the aforementioned method, including a combination of devices for performing the steps described above, as well as an optical identification element that results from the steps of the method or process shown and described herein.

One advantage of the present invention is that conventional technology may be used to fabricate an optical identification element with a high level of flexibility.

In effect, the present invention potentially adds a whole new dimension to existing biochip technology.

BRIEF DESCRIPTION OF THE DRAWINGS

The drawing, which is not drawn to scale, includes the following.

DETAILED DESCRIPTION OF THE INVENTION

Figure 1:
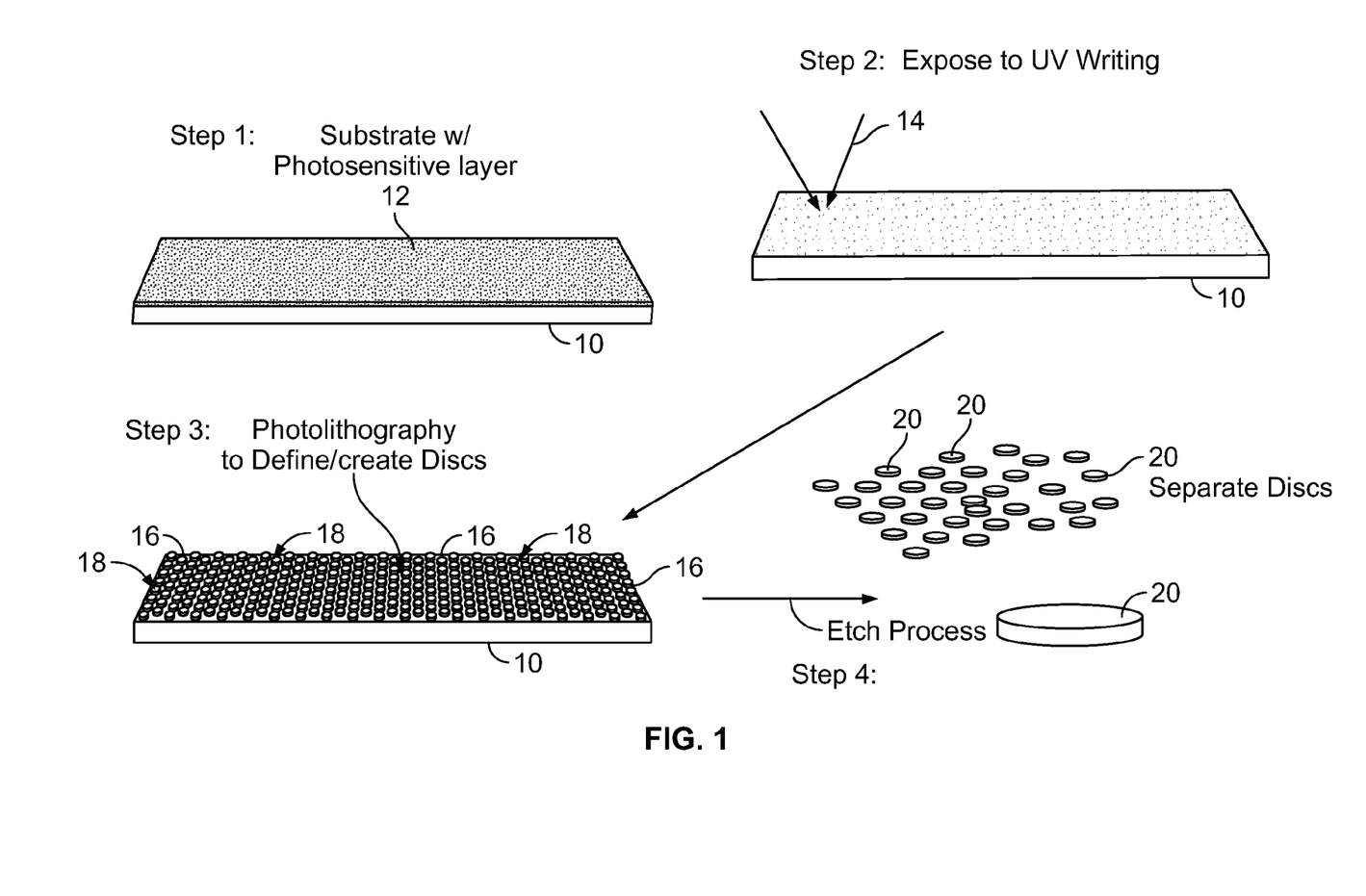
FIG. 1 is a diagram of steps for fabricating a optical identification element according to the present invention.

FIG. 1 shows steps 1-4 for performing a method for fabricating an optical identification element 20 (see also FIG. 4) according to the present invention.

In step 1, a removable plate or substrate 10 having a photosensitive material 10 fabricated thereon. Suitable photosensitive materials are known in the art, and the scope of the invention is not intended to be limited to any particular kind either now known or later developed in the future. The plate or substrate 10 may take the form of many different medium or material, including, but not limited to, an optical medium or material, although the scope of the invention is also intended to include other materials for the substrate now known or later developed in the future.

In step 2, one or more gratings 13 (best shown in FIGS. 2 and 4) are written on the photosensitive material 12, for example, by exposing the photosensitive material 12 to ultraviolet (UV) light 14, although the scope of the invention is also intended to include using other grating writing techniques either now known or later developed in the future.

In step 3, one or more lines 16 are etched or formed to create and form one or more separate optical identification elements that are generally indicated as 18 in FIG. 1 using photolithography to define/create the same, although the scope of the invention is also intended to include using other etching techniques either now known or later developed in the future.

In step 4, the etching process in step 3 results in the formation of the one or more separate optical identification elements 20. In this case, the elements 18 are removed or separated from the substrate 10 by the etching process. Alternatively, the elements 18 may be removed or separated from the substrate 10 by exposing them in a suitable solution and form the one or more optical identification elements 20. Such a suitable solution is known in the art, and the scope of the invention is not intended to be limited to any particular type or kind thereof. The one or more separate optical identification element 20 take the form of planar elements, as distinguished from optical fiber, optical filaments, or the like that are known in the art.

Moreover, the scope of the invention is intended to include the optical identification element 20 taking the form of a holographic optical identification element or other suitable optical identification element having an interference pattern reproduced from a pattern of interference produced by a split coherent beam of radiation (as a laser) either now known or later developed in the future, or by any of the techniques described in U.S. patent application Ser. No. 10/661,234 or U.S. patent application Ser. No. 10/661,116, and other related cases referenced herein. Moreover, the optical identification elements 20 may take the geometric form of one or more planar objects, including plates, bars, bricks, discs, slabs, chips, or other suitable planar geometric shape and/or dimensionality now known or later developed in the future, including those described in U.S. patent application Ser. No. 10/661,234 and other patent applications referenced herein.

Alternative Technique

Figure 2:
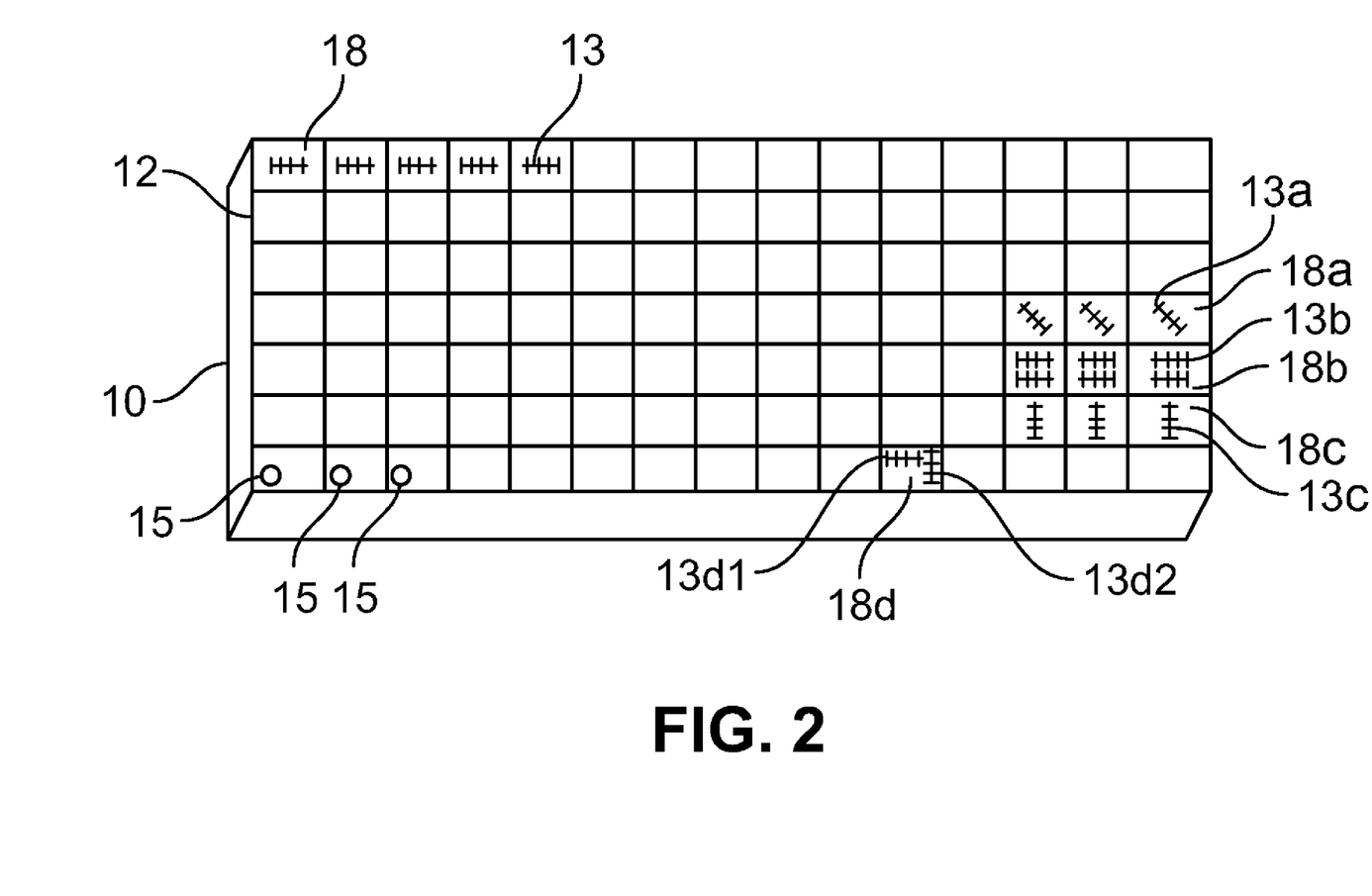
FIG. 2 is a diagram of a partially etched substrate according to the present invention.

The present invention also provides an alternative format micro "chip" assay technique relating to code reading via embedded collocated gratings, as follows:

Grating Orientation:

The scope of the invention is intended to include at least the following grating orientation techniques shown by way of example in FIG. 2:

1) Writing grating codes 13a, 13b, 13c, 13d1, 13d2 at multiple axes across each disc or element 18—where a single axis reader always may be used to pick up one code.

2) Adding orientation 'marker' 15 to one or more discs or elements 18, such as by adding one or more of the following:
a) Magnetic material for self-alignment;
b) Birefringence; or
c) Fluorescence to determine alignment/orientation.

3). Putting each "bit" in along a different axis and use a spinning readout system (e.g. each bit assessed).

The Optical Arrangement or Apparatus

The scope of the invention is also intended to include an optical arrangement or apparatus for fabricating an optical identification element consistent with the description of the aforementioned method, including a combination of devices for performing the steps described above. For example, FIG. 3 shows the optical arrangement or apparatus generally indicated as 30 for fabricating such an optical identification element 20, including the combination of a means or device 32 for providing a removable plate or substrate 10 having the photosensitive material 12 fabricated thereon; a means or device 34 for writing one or more gratings 13, 13a, 13b, 13c, 13d1, 13d2 (see FIG. 2) on the photosensitive material 12; and a means or device 36 for separating and creating the one or more separate optical identification elements 20, including by, e.g., etching the lines 16 on the photosensitive material 12.

The Optical Identification Element 20

Figure 3:
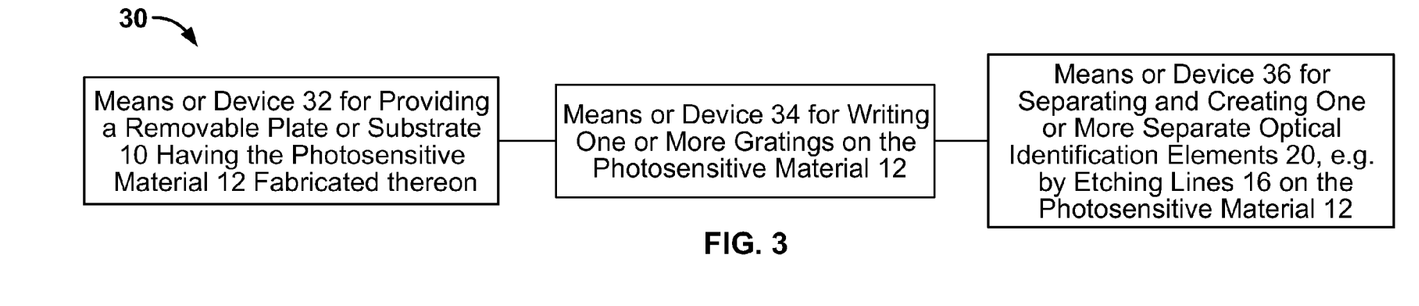
FIG. 3 is a block diagram of an optical arrangement for fabricating an optical identification element according to the present invention.
Figure 4:
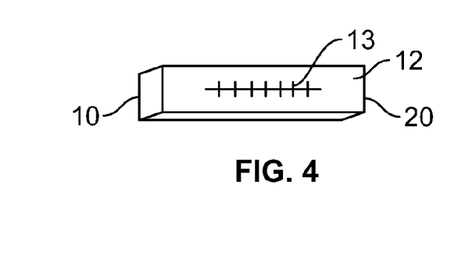
FIG. 4 is a diagram of an optical identification element according to the present invention.

FIG. 4 shows, by way of example, the optical identification element 20 in greater detail that results from the steps of the method or process shown in FIG. 1, and/or the optical arrangement shown in FIG. 3. The scope of the invention is also intended to include the optical identification element itself made by the method or process set forth above, including, but not limited to, a holographic optical identification element made from the lithographic technique described herein. The present invention may be used to create the encoded elements consistent with that described in copending U.S. patent application Ser. No. 10/661,234, filed 12 Sep. 2003 and the other patent applications referenced herein, which are incorporated herein by reference in their entirety.

Figure 5:
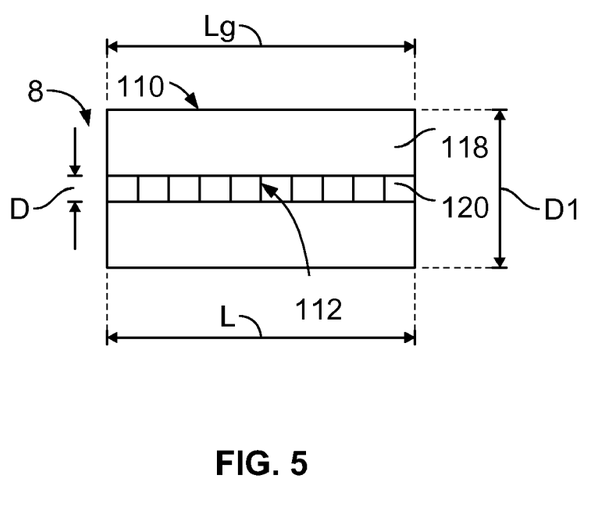
FIG. 5 is a side view of an optical identification element.

Referring to FIG. 5, an optical identification element 8 comprises a known optical substrate 110, having an optical diffraction grating 112 disposed (or written, impressed, embedded, imprinted, etched, grown, deposited or otherwise formed) in the volume of or on a surface of a substrate 110. The grating 112 is a periodic or aperiodic variation in the effective refractive index and/or effective optical absorption of at least a portion of the substrate 110.

The substrate 110 has an inner region 120 where the grating 112 is located. The inner region may be photosensitive to allow the writing or impressing of the grating 112. The substrate 110 has an outer region 118 which does not have the grating 112 therein.

The grating 112 is a combination of one or more individual spatial periodic sinusoidal variations in the refractive index that are collocated along the length of the grating region 120 of the substrate 110, each having a spatial period (or pitch) $\Lambda$. The grating 112 (or a combination of gratings) represents a unique optically readable code, made up of bits. In one embodiment, a bit corresponds to a unique pitch $\Lambda$ within the grating 112.

The grating 112 may also be referred to herein as a composite or collocated grating. Also, the grating 112 may be referred to as a "hologram", as the grating 112 transforms, translates, or filters an input optical signal to a predetermined desired optical output pattern or signal.

The substrate 110 comprises silica glass ($SiO_2$) having the appropriate chemical composition to allow the grating 112 to be disposed therein or thereon. Other materials for the optical substrate 110 may be used if desired. For example, the substrate 110 may be made of any glass, e.g., silica, phosphate glass, borosilicate glass or other glasses, or made of glass and plastic, or solely plastic. For high temperature or harsh chemical applications, the optical substrate 110 made of a glass material is desirable. If a flexible substrate is needed, a plastic, rubber or polymer-based substrate may be used. The optical substrate 110 may be any material capable of having the grating 112 disposed in the grating region 120 and that allows light to pass through it to allow the code to be optically read.

The optical substrate 110 with the grating 112 has a length L and an outer diameter D1, and the inner region 120 diameter D. The length L can range from very small (about 1-1000 microns or smaller) to large (about 1.0-1000 mm or greater). In addition, the outer dimension D1 can range from small (less than 1000 microns) to large (1.0-1000 mm and greater). Other dimensions and lengths for the substrate 110 and the grating 112 may be used.

The grating 112 may have a length Lg of about the length L of the substrate 110. Alternatively, the length Lg of the grating 112 may be shorter than the total length L of the substrate 110.

Figure 6:
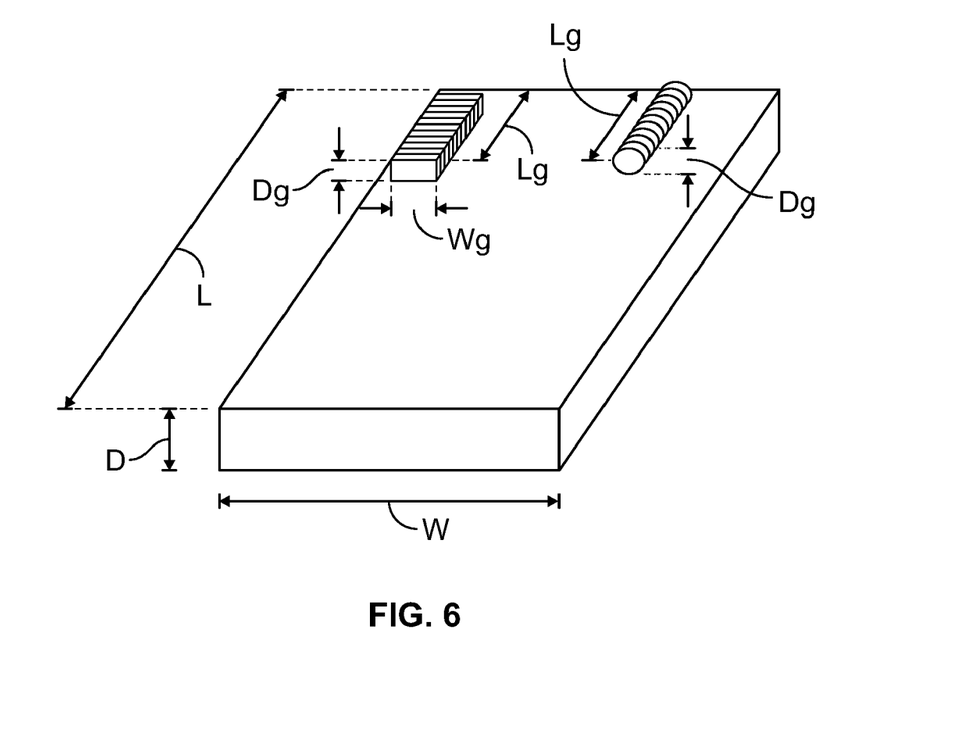
FIG. 6 is a perspective view of an optical identification element having a grating that is smaller than the substrate.

Moreover, referring to FIG. 6, the size of any given dimension for the region 120 of the grating 112 may be less than any corresponding dimension of the substrate 110. For example, if the grating 112 has dimensions of length Lg, depth Dg, and width Wg, and the substrate 110 has dimensions of length L, depth D, and width W, the dimensions of the grating 112 may be less than that of the substrate 110. Thus, the grating 112, may be embedded within or part of a much larger substrate 110. Instead of rectangular dimensions or coordinates for size of the substrate 110, the element 8, or the grating 112, other dimensions/coordinates for size may be used, e.g., polar or vector dimensions.

Also, the element 8 may be embedded or formed in or on a larger object for identification of the object.

The substrate 110 may have end-view cross-sectional shapes other than circular, such as square, rectangular, elliptical, clam-shell, D-shaped, or other shapes, and may have side-view sectional shapes other than rectangular, such as circular, square, elliptical, clam-shell, D-shaped, or other shapes. Also, 3D geometries other than a cylinder may be used, such as a sphere, a cube, a pyramid, a bar, a slab, a plate, a brick, or a disc shape, or any other 3D shape. Alternatively, the substrate 110 may have a geometry that is a combination of one or more of the foregoing shapes.

The dimensions, geometries, materials, and material properties of the substrate 110 are selected such that the desired optical and material properties are met for a given application. The resolution and range for the optical codes are scalable by controlling these parameters (discussed more hereinafter).

The substrate 110 may be coated with a polymer material or other material that may be dissimilar to the material of the substrate 110, provided that the coating on at least a portion of the substrate, allows sufficient light to pass transversely through the substrate for adequate optical detection of the code using side illumination.

Figure 7:
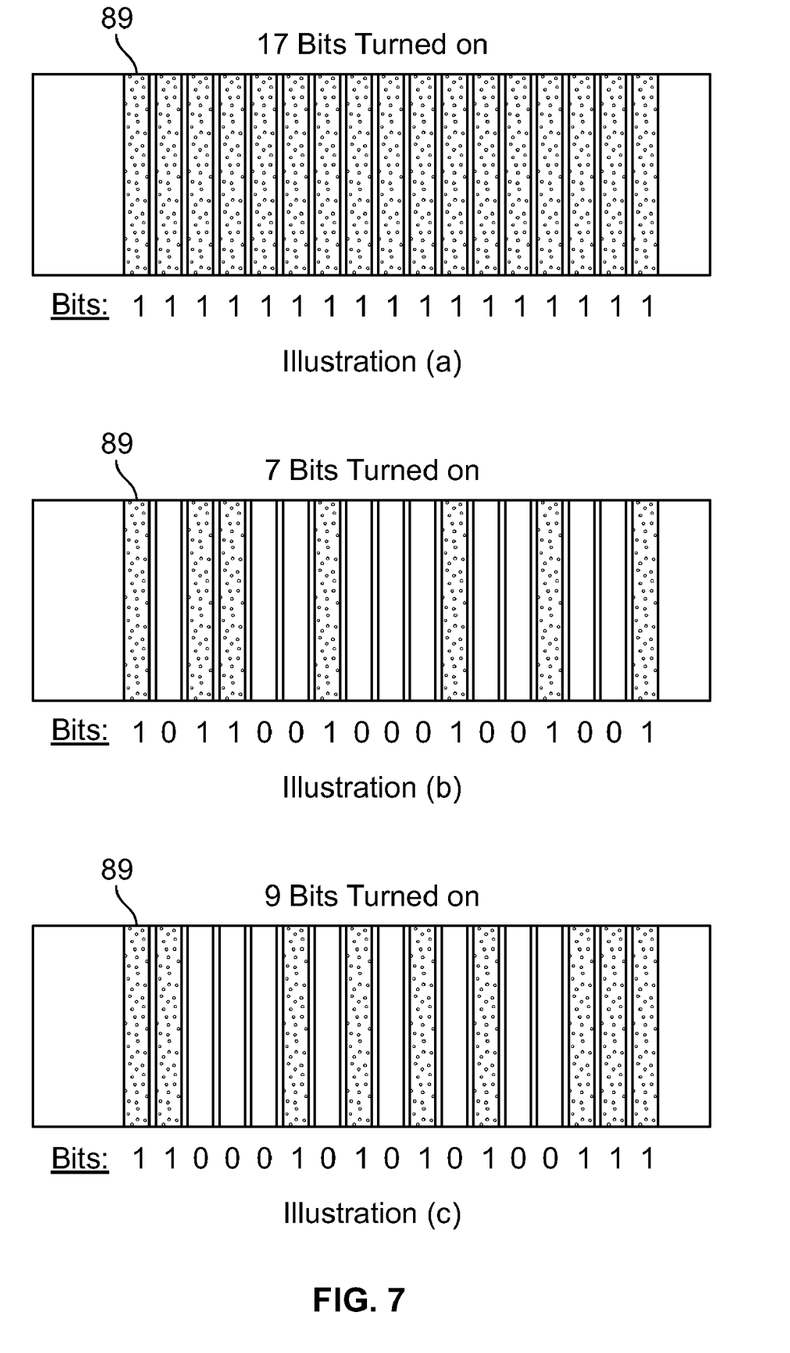
FIGS. 7(a)-(c) show images of digital codes on a CCD camera.

Referring to FIG. 7, illustrations (a)-(c), for the grating 112 in a cylindrical substrate 110 having a sample spectral 17 bit code (i.e., 17 different pitches Λ1-Λ17), the corresponding image on a CCD (Charge Coupled Device) camera is shown for a digital pattern of 17 bit locations 89. FIG. 7(b), (c), and (a), respectively, illustrate 7 bits turned on (10110010001001001); 9 bits turned on (11000101010100111); and all 17 bits turned on (11111111111111111).

For the images in FIG. 7, the length of the substrate 110 was 450 microns, the outer diameter D1 was 65 microns, the inner diameter D was 14 microns, δn for the grating 112 was about $10^{-4}$, n1 in portion 120 was about 1.458 (at a wavelength of about 1550 nm), n2 in portion 118 was about 1.453, the average pitch spacing Λ for the grating 112 was about 0.542 microns, and the spacing between pitches ΔΛ was about 0.36% of the adjacent pitches Λ.

The grating 112 may be impressed in the substrate 110 by any technique for writing, impressed, embedded, imprinted, or otherwise forming a diffraction grating in the volume of or on a surface of a substrate 110. Examples of some known techniques are described in U.S. Pat. Nos. 4,725,110 and 4,807,950, entitled "Method for Impressing Gratings Within Fiber Optics", to Glenn et al; and U.S. Pat. No. 5,388,173, entitled "Method and Apparatus for Forming A periodic Gratings in Optical Fibers", to Glenn, respectively, and U.S. Pat. No. 5,367,588, entitled "Method of Fabricating Bragg Gratings Using a Silica Glass Phase Grating Mask and Mask Used by Same", to Hill, and U.S. Pat. No. 3,916,182, entitled "Periodic Dielectric Waveguide Filter", Dabby et al, and U.S. Pat. No. 3,891,302, entitled "Method of Filtering Modes in Optical Waveguides", to Dabby et al, which are all incorporated herein by reference to the extent necessary to understand the present invention.

Alternatively, instead of the grating 112 being impressed within the substrate material, the grating 112 may be partially or totally created by etching or otherwise altering the outer surface geometry of the substrate to create a corrugated or varying surface geometry of the substrate, such as is described in U.S. Pat. No. 3,891,302, entitled "Method of Filtering Modes in Optical Waveguides", to Dabby et al, which is incorporated herein by reference to the extent necessary to understand the present invention, provided the resultant optical refractive profile for the desired code is created.

Further, alternatively, the grating 112 may be made by depositing dielectric layers onto the substrate, similar to the way a known thin film filter is created, so as to create the desired resultant optical refractive profile for the desired code.

Unless otherwise specifically stated herein, the term "microbead" is used herein as a label and does not restrict any embodiment or application of the present invention to certain dimensions, materials and/or geometries.

Applications, Uses, Geometries and Embodiments for the Encoded Element of the Present Invention Applications, uses, geometries and embodiments for the encoded element of the present invention may be the' same as that described in the following cases which are all incorporated herein by reference in their entirety: U.S. patent application Ser. No. 10/661,234, filed Sep. 12, 2003, entitled "Diffraction Grating-Based Optical Identification Element"; U.S. patent application Ser. No. 10/661,031 filed Sep. 12, 2003, entitled "Diffraction Grating-Based Encoded Microparticles for Multiplexed Experiments"; U.S. patent application Ser. No. 10/661,082, filed Sep. 12, 2003, entitled "Method and Apparatus for Labeling Using Diffraction Grating-Based Encoded Optical Identification Elements"; U.S. patent application Ser. No. 10/661,115, filed Sep. 12, 2003, entitled "Assay Stick"; U.S. patent application Ser. No. 10/661,836, filed Sep. 12, 2003, entitled "Method and Apparatus for Aligning Microbeads in order to Interrogate the Same"; U.S. patent application Ser. No. 10/661,254, filed Sep. 12, 2003, entitled "Chemical Synthesis Using Diffraction Grating-based Encoded Optical Elements"; U.S. patent application Ser. No. 10/661,116, filed Sep. 12, 2003, entitled "Method of Manufacturing of a Diffraction grating-based identification Element"; and U.S. patent application Ser. No. 10/763,995, filed Jan. 22, 2004, entitled, "Hybrid Random Bead/Chip Based Microarray", U.S. Provisional Patent Application Ser. Nos. 60/609,583, 60/610,059 and 60/609,712, all filed Sep. 13, 2004; U.S. Provisional Patent Application Ser. Nos. 60/611,205, 60/610,910, 60/610,833, 60/610,829, 60/610, 928, all filed Sep. 17, 2004; U.S. Provisional Patent Application Ser. No. 60/611,676, filed Sep. 20, 2004; and U.S. patent application Ser. No. 10/956,791, filed Oct. 1, 2004.

Computer Programs and Other Data Processing Methods

Various aspects of the present invention may be conducted in an automated or semi-automated manner, generally with the assistance of well-known data processing methods. Computer programs and other data processing methods well known in the art may be used to store information including e.g. microbead identifiers, probe sequence information, sample information, and binding signal intensities. Data processing methods well known in the art may be used to read input data covering the desired characteristics.

Applications

The invention may be used in many areas such as drug discovery, functionalized substrates, biology, proteomics, combinatorial chemistry, DNA analysis/tracking/sorting/tagging, as well as tagging of molecules, biological particles, matrix support materials, immunoassays, receptor binding assays, scintillation proximity assays, radioactive or nonradioactive proximity assays, and other assays, (including fluorescent, mass spectroscopy), high throughput drug/genome screening, and/or massively parallel assay applications. The invention provides uniquely identifiable beads with reaction supports by active coatings for reaction tracking to perform multiplexed experiments.

SCOPE OF THE INVENTION

The dimensions and/or geometries for any of the embodiments described herein are merely for illustrative purposes and, as such, any other dimensions and/or geometries may be used if desired, depending on the application, size, performance, manufacturing requirements, or other factors, in view of the teachings herein.

It should be understood that, unless stated otherwise herein, any of the features, characteristics, alternatives or modifications described regarding a particular embodiment herein may also be applied, used, or incorporated with any other embodiment described herein. Also, the drawings herein are not drawn to scale.

Although the invention has been described and illustrated with respect to exemplary embodiments thereof, the foregoing and various other additions and omissions may be made therein and thereto without departing from the spirit and scope of the present invention.

Moreover, the invention comprises the features of construction, combination of elements, and arrangement of parts which will be exemplified in the construction hereinafter set forth.

It will thus be seen that the objects set forth above, and those made apparent from the preceding description, are efficiently attained and, since certain changes may be made in the above construction without departing from the scope of the invention, it is intended that all matter contained in the above description or shown in the accompanying drawing shall be interpreted as illustrative and not in a limiting sense.

We claim:

1. A method for fabricating microparticles comprising:
providing a base substrate including a particle layer thereon, the particle layer having a photosensitive material;
providing optically detectable codes in the photosensitive material of the particle layer; and
etching lines into the particle layer to create a plurality of microparticles, the microparticles having inner and outer regions, each inner region being surrounded by a corresponding outer region formed from the particle layer and including at least one of the optically detectable codes therein, the microparticles having elongated bodies that extend in an axial direction, the optically detectable codes extending in the axial direction within the microparticles.

2. The method in accordance with claim 1, wherein each of the inner regions is enclosed within and surrounded by the corresponding outer region.

3. The method in accordance with claim 1 wherein at least one of the optically detectable codes is defined by a grating that is formed in the corresponding inner region.

4. The method in accordance with claim 1 wherein the optically detectable codes are provided by modifying portions of the corresponding inner regions to reflect light in a predetermined optical output pattern.

5. The method in accordance with claim 1 wherein at least one of the optically detectable codes is defined by a diffraction grating.

6. The method in accordance with claim 1 further comprising releasing the microparticles from the base substrate.

7. The method in accordance with claim 1 wherein said etching the lines into the particle layer includes etching the lines such that the optically detectable codes extend along the axial direction and through a center of the elongated body.

8. The method in accordance with claim 1 wherein said etching the lines into the particle layer includes using photolithography.

9. The method in accordance with claim 1 wherein the optically detectable codes are one of written, impressed, embedded, imprinted, etched, grown, and deposited within the inner regions.

10. The method in accordance with claim 1 wherein the optically detectable codes include gratings that are etched within the inner regions.

11. The method in accordance with claim 1 wherein the optically detectable codes constitute digital codes.

12. The method in accordance with claim 1 wherein the microparticles have corresponding longitudinal axes extending in the axial direction through the inner regions, the outer region extending around the longitudinal axis of the corresponding inner region.

13. The method in accordance with claim 12 wherein said etching the lines into the particle layer includes etching the lines such that the elongated bodies are rectangular and have a substantially square cross-section taken transverse to the longitudinal axis.

14. The method in accordance with claim 12 wherein the outer region completely surrounds the inner region about the longitudinal axis.

15. The method in accordance with claim 1 wherein the optically detectable codes are periodic or aperiodic variations in at least one of a refractive index and an optical absorption of the corresponding inner regions.

16. The method in accordance with claim 1 wherein the optically detectable codes are distributed apart from each other within the particle layer.

17. The method in accordance with claim 1 wherein the optically detectable codes are separated by a layer material in the particle layer, the layer material becoming the outer regions when the particle layer is etched.

18. The method in accordance with claim 1 wherein the optically detectable codes are oriented in a common direction within the particle layer.

19. The method in accordance with claim 1 wherein the plurality of microparticles is a first plurality of microparticles, a second plurality of microparticles being created when the particle layer is etched, wherein the first plurality of microparticles have optically detectable codes oriented in a first direction and the second plurality of microparticles have optically detectable codes oriented in a different second direction.

20. The method in accordance with claim 1 wherein the outer region comprises a transparent solid material, wherein light is transmitted through the outer region and reflected or filtered by the optically detectable code.

21. The method in accordance with claim 1 wherein the outer region provides mechanical or structural support of the inner region.

22. The method in accordance with claim 1 wherein the optically detectable codes are provided in the photosensitive material of the particle layer after the base substrate having the particle layer thereon is provided.

23. A method for fabricating microparticles comprising:
providing a removable base substrate including a particle layer thereon, the particle layer having a photosensitive material, the particle layer including optically detectable codes embedded in predetermined regions of the particle layer; and
etching lines into the particle layer to create a plurality of microparticles, the predetermined regions becoming inner regions of the microparticles when the particle layer is etched, the inner regions having at least one of the optically detectable codes therein, the microparticles also having outer regions formed from the particle layer that surround the inner regions, the microparticles having elongated bodies that extend in an axial direction, the optically detectable codes extending in the axial direction within the microparticles.

24. The method in accordance with claim 23 wherein the optically detectable codes are distributed apart from each other within the particle layer.

25. The method in accordance with claim 23 wherein the optically detectable codes are separated by a layer material in the particle layer, the layer material becoming the outer regions when the particle layer is etched.

26. The method in accordance with claim 23 wherein the optically detectable codes are oriented in a common direction within the particle layer.

27. The method in accordance with claim 23 wherein at least one of the optically detectable codes is defined by a grating that is formed in the corresponding inner region.

28. The method in accordance with claim 23 further comprising providing the optically detectable codes within the particle layer.

29. The method in accordance with claim 28 wherein the optically detectable codes are provided by modifying portions of the corresponding inner regions to reflect light in a predetermined optical output pattern.

30. The method in accordance with claim 23 wherein at least one of the optically detectable codes is defined by a diffraction grating.

31. The method in accordance with claim 23 further comprising releasing the microparticles from the base substrate.

32. The method in accordance with claim 23 wherein the optically detectable codes are one of written, impressed, embedded, imprinted, etched, grown, and deposited within the inner regions.

33. The method in accordance with claim 23 wherein the optically detectable codes constitute digital codes.

34. The method in accordance with claim 23 wherein the optically detectable codes include gratings that are etched within the inner regions.

35. The method in accordance with claim 23 wherein the microparticles have corresponding longitudinal axes extending in the axial direction through the inner regions, the outer region extending around the longitudinal axis of the corresponding inner region.

36. The method in accordance with claim 35 wherein the outer region completely surrounds the inner region about the longitudinal axis.

37. The method in accordance with claim 35 wherein said etching the lines into the particle layer includes etching the lines such that the elongated bodies are rectangular and have a substantially square cross-section taken transverse to the longitudinal axis.

38. The method in accordance with claim 23 wherein the optically detectable codes are periodic or aperiodic variations in at least one of a refractive index and an optical absorption of the corresponding inner regions.

39. The method in accordance with claim 23 wherein the outer region comprises a transparent solid material, wherein light is configured to be transmitted through the outer region and reflected or filtered by the optically detectable code.

40. The method in accordance with claim 39 wherein the outer regions provide mechanical or structural support of the corresponding inner regions.

* * * * *